(12) United States Patent
Chen

(10) Patent No.: US 12,336,419 B2
(45) Date of Patent: Jun. 17, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zhuofan Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/754,243

(22) PCT Filed: Mar. 9, 2022

(86) PCT No.: PCT/CN2022/079997
§ 371 (c)(1),
(2) Date: Mar. 28, 2022

(87) PCT Pub. No.: WO2023/164960
PCT Pub. Date: Sep. 7, 2023

(65) Prior Publication Data
US 2024/0057456 A1 Feb. 15, 2024

(30) Foreign Application Priority Data
Mar. 1, 2022 (CN) .......... 202210193616.X

(51) Int. Cl.
*H10K 59/80* (2023.01)
*H10K 50/858* (2023.01)
(Continued)

(52) U.S. Cl.
CPC ......... *H10K 59/879* (2023.02); *H10K 50/858* (2023.02); *H10K 59/35* (2023.02);
(Continued)

(58) Field of Classification Search
CPC .. H10K 59/879; H10K 59/353; H10K 77/111; H10K 2102/351; H10K 59/35; H10K 50/858; Y02E 10/549
See application file for complete search history.

(56) References Cited

U.S. PATENT DOCUMENTS 11,963,425 B1 * 4/2024 Wittenberg .......... H04M 1/0268
2019/0013495 A1 * 1/2019 Kim .................... H10K 59/8792
(Continued)

FOREIGN PATENT DOCUMENTS

| CN | 110164938 A | 8/2019 |
|---|---|---|
| CN | 111446276 A | 7/2020 |

(Continued)

OTHER PUBLICATIONS

International Search Report in International application No. PCT/CN2022/079997, mailed on Nov. 30, 2022.
(Continued)

*Primary Examiner* — Britt D Hanley
*Assistant Examiner* — Victor V Barzykin
(74) *Attorney, Agent, or Firm* — PV IP PC; Wei Te Chung

(57) ABSTRACT

A display device is provided. In per unit area of the display device, a light-concentrating intensity of light emitted from sub-pixels in a non-planar display area and passing through a first optical film layer and a second optical film layer at a front viewing angle is less than a light-concentrating intensity of light emitted from the sub-pixels in a planar display area and passing through the first optical film layer and the second optical film layer at the front viewing angle. Poor (Continued)

user experiences at a certain viewing angle in the non-planar display area can be improved.

9 Claims, 3 Drawing Sheets

(51) Int. Cl.
*H10K 59/35* (2023.01)
*H10K 77/10* (2023.01)
*H10K 102/00* (2023.01)

(52) U.S. Cl.
CPC .......... *H10K 59/353* (2023.02); *H10K 77/111* (2023.02); *H10K 2102/351* (2023.02); *Y02E 10/549* (2013.01)

(56) References Cited

U.S. PATENT DOCUMENTS

| 2022/0344405 | A1* | 10/2022 | Zhu | H04B 10/116 |
| 2023/0096530 | A1* | 3/2023 | Kim | H10K 59/12 |
| | | | | 428/212 |

FOREIGN PATENT DOCUMENTS

| CN | 111508343 | A | 8/2020 |
| CN | 111755492 | A | 10/2020 |
| CN | 111834542 | A | 10/2020 |
| CN | 112086578 | A | 12/2020 |
| CN | 112420783 | A | 2/2021 |
| CN | 113394351 | A | 9/2021 |
| CN | 113745298 | A | 12/2021 |
| CN | 114023908 | A | 2/2022 |
| CN | 114613813 | A | 6/2022 |
| KR | 20210026452 | A | 3/2021 |
| WO | 2021175120 | A1 | 9/2021 |

OTHER PUBLICATIONS

Written Opinion of the International Search Authority in International application No. PCT/CN2022/079997, mailed on Nov. 30, 2022.
Chinese Office Action issued in corresponding Chinese Patent Application No. 202210193616.X dated Nov. 11, 2022, pp. 1-5.
Korean Office Action issued in corresponding Korean Patent Application No. 10-2022-7023602 dated Feb. 15, 2024, pp. 1-7.
Japanese Office Action issued in corresponding Japanese Patent Application No. 特願2022-552426 dated Mar. 15, 2024, pp. 1-4.

* cited by examiner

DISPLAY DEVICE

FIELD OF INVENTION

The present disclosure relates to the field of display technologies, and more particularly, to a display device.

BACKGROUND OF INVENTION

Organic light-emitting diodes (OLEDs) are organic thin film electroluminescent devices. Since the OLEDs have advantages of easiness to form flexible structures, wide viewing angles, low voltage requirements, high power saving efficiency, fast response times, light weight, thinness, simple structures, low cost, extremely high contrast, and low power consumption, they have become one of most important display technologies in current technology.

Technical problem: in order to reduce power consumption and improve display luminous efficiency of OLED display devices, light-concentrating structures are generally disposed on a light-emitting side of light-emitting units of the display devices to concentrate light emitted from the light-emitting units, thereby improving a light extraction intensity. At present, a material of the light-concentrating structures is relatively fragile. In a non-planar display area, a sudden change in a shape of the light-concentrating structures is prone to cause stress concentration at the light-concentrating structures, which leads to detachment and cracks of the light-concentrating structures.

SUMMARY OF INVENTION

An objective of the present disclosure is to provide a display device, which can solve the problem of the stress concentration at the light-concentrating structures caused by the sudden change in the shape of the light-concentrating structures, thereby leading to detachment and cracks of the light-concentrating structures.

In order to solve the above problem, the present disclosure provides a display device, which has a planar display area and a non-planar display area and includes: a substrate; a light-emitting layer disposed on one side of the substrate and including a plurality of sub-pixels arranged spaced apart from each other; a first optical film layer disposed on one side of the light-emitting layer away from the substrate, wherein, the first optical film layer is provided with at least one first opening corresponding to a position of the sub-pixels in the planar display area, and the first optical film layer is provided with at least one second opening corresponding to a position of the sub-pixels in the non-planar display area; and a second optical film layer covering one side of the first optical film layer away from the substrate and filled in the first opening and the second opening, wherein, a refractive index of the first optical film layer is less than a refractive index of the second optical film layer; wherein, in per unit area, a light-concentrating intensity of light emitted from the sub-pixels in the non-planar display area and passing through the first optical film layer and the second optical film layer at a front viewing angle is less than a light-concentrating intensity of light emitted from the sub-pixels in the planar display area and passing through the first optical film layer and the second optical film layer at the front viewing angle.

Further, in a cross-section perpendicular to the substrate, an included angle between a tangent line of a side wall of the second opening and the substrate is less than an included angle between a tangent line of a side wall of the first opening and the substrate.

Further, in the non-planar display area, a minimum thickness of the first optical film layer corresponding to the second opening ranges from 10% to 30% of a maximum thickness of the first optical film layer not corresponding to the second opening.

Further, in the non-planar display area, the minimum thickness of the first optical film layer corresponding to the second opening ranges from 0.3 µm to 0.7 µm, and the maximum thickness of the first optical film layer not corresponding to the second opening ranges from 1.5 µm to 2.5 µm.

Further, the second opening is a groove which does not penetrate through the first optical film layer, and a cross-sectional shape of the second opening is arc; and the first opening penetrates through the first optical film layer.

Further, the included angle between the tangent line of the side wall of the second opening and the substrate ranges from 20° to 50°.

Further, the first opening and the second opening both penetrate through the first optical film layer; and cross-sectional shapes of the first opening and the second opening are inverted trapezoidal, and the included angle between the tangent line of the side wall of the first opening and the substrate ranges from 65° to 75°.

Further, a density of the second opening in the non-planar display area is less than or equal to a density of the first opening in the planar display area.

Further, the sub-pixels include red sub-pixels, green sub-pixels, and blue sub-pixels; and the density of the second opening corresponding to the green sub-pixels in the non-planar display area ranges from 0% to 75% of the density of the first opening corresponding to the green sub-pixels in the planar display area.

Further, the refractive index of the first optical film layer ranges from 1.3 to 1.6, and the refractive index of the second optical film layer ranges from 1.5 to 1.9.

Beneficial effect: in the display device of the present disclosure, in per unit area, the light-concentrating intensity of light emitted from the sub-pixels in the non-planar display area and passing through the first optical film layer and the second optical film layer at the front viewing angle is less than the light-concentrating intensity of light emitted from the sub-pixels in the planar display area and passing through the first optical film layer and the second optical film layer at the front viewing angle. Therefore, poor user experiences at a certain viewing angle in the non-planar display area in current technology can be improved, thereby improving user experiences.

In the display device of the present disclosure, the included angle between the tangent line of the side wall of the second opening and the substrate is less than the included angle between the tangent line of the side wall of the first opening and the substrate. Therefore, stresses in the non-planar display area can be reduced, thereby reducing the stress concentration effect in the non-planar display area and preventing the first optical film layer and the second optical film layer from falling off or cracking. Further, the light-concentrating effect in the non-planar display area can also be reduced, so poor user experiences at a certain viewing angle in the non-planar display area in current technology can be improved, thereby improving user experiences.

In the display device of the present disclosure, the second opening is the groove which does not penetrate through the first optical film layer, and the cross-sectional shape of the second opening is arc. Therefore, stresses in the non-planar display area can be reduced, thereby reducing the stress concentration effect in the non-planar display area and preventing the first optical film layer and the second optical film layer from falling off or cracking. Further, the light-concentrating effect in the non-planar display area can also be reduced, so poor user experiences at a certain viewing angle in the non-planar display area in current technology can be improved, thereby improving user experiences.

In the display device of the present disclosure, the density of the second opening in the non-planar display area is less than the density of the first opening in the planar display area, that is, the density of the second opening in the non-planar display area is reduced. Therefore, stresses in the non-planar display area can be reduced, thereby reducing the stress concentration effect in the non-planar display area and preventing the first optical film layer and the second optical film layer from falling off or cracking. Further, the light-concentrating effect in the non-planar display area can also be reduced, so poor user experiences at a certain viewing angle in the non-planar display area in current technology can be improved, thereby improving user experiences.

DESCRIPTION OF DRAWINGS

The accompanying figures to be used in the description of embodiments of the present disclosure will be described in brief to more clearly illustrate the technical solutions of the embodiments. The accompanying figures described below are only a part of the embodiments of the present disclosure, from which those skilled in the art can derive further figures without making any inventive efforts.

Figure 1:
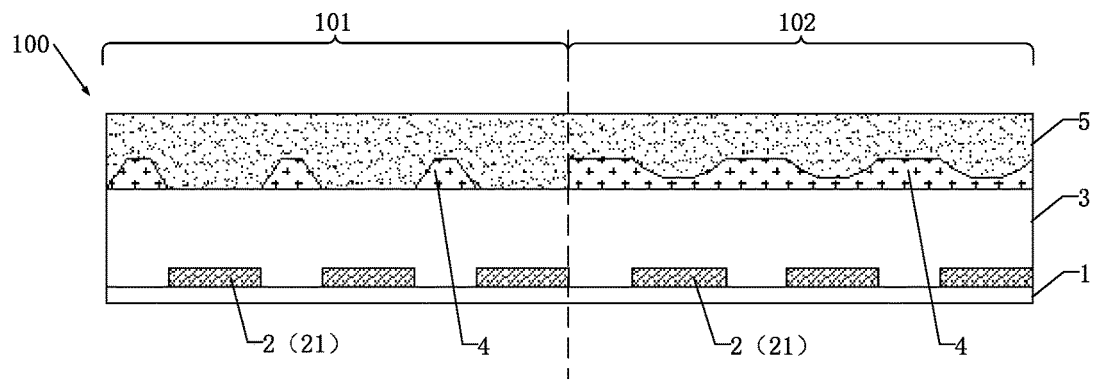
FIG. 1 is a schematic structural diagram of a display device before bending according to embodiment 1 of the present disclosure.

Elements in the drawings are designated by reference numerals listed below:

100. display device; 101. planar display area;
102. non-planar display area;
1. substrate; 2. light-emitting layer;
3. encapsulation layer; 4. first optical film layer;
5. second optical film layer;
41. first opening; 42. second opening;
21. sub-pixel; 211. red sub-pixel;
212. green sub-pixel; and 213. blue sub-pixel.

DETAILED DESCRIPTION OF PREFERRED EMBODIMENTS

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown for ease of understanding and description, and the present disclosure does not limit the size and thickness of each component.

Embodiment 1

As shown in FIG. 1, this embodiment provides a display device 100. The display device 100 includes a planar display area 101 and a non-planar display area 102.

In this embodiment, the display device 100 is a curved display device, and the non-planar display area 102 is a curved display area. In other embodiments, the display device 100 may also be a foldable display device, and the non-planar display area 102 is a bending display area.

As shown in FIG. 1, the display device 100 includes a substrate 1, a light-emitting layer 2, an encapsulation layer 3, a first optical film layer 4, and a second optical film layer 5.

Wherein, the substrate 1 is located in the planar display area 101 and the non-planar display area 102. A material of the substrate 1 may be one or more of glass, polyimide, polycarbonate, polyethylene terephthalate, or polyethylene naphthalate. Therefore, the substrate 1 can have a better impact resistance, thereby effectively protecting the display device 100.

The light-emitting layer 2 is disposed on the substrate 1. The light-emitting layer 2 includes a plurality of sub-pixels 21 arranged spaced apart from each other on the substrate 1.

The encapsulation layer 3 is disposed on one side of the light-emitting layer 2 away from the substrate 1. The encapsulation layer 3 is mainly used to prevent water and oxygen from intruding the light-emitting layer 2, thereby improving a service life of the display device 100. Specifically, the encapsulation layer 3 may include a first inorganic layer, an organic layer, and a second inorganic layer.

As shown in FIG. 1, the first optical film layer 4 is disposed on one side of the encapsulation layer 3 away from the substrate 1. A refractive index of the first optical film layer 4 ranges from 1.3 to 1.6. In this embodiment, the refractive index of the first optical film layer 4 is 1.4. A material of the first optical film layer 4 may be an organic material such as acrylic or an epoxy resin, or may also be an inorganic material such as $SiO_2$ or SiON.

As shown in FIG. 1, the second optical film layer 5 covers one side surface of the first optical film layer 4 away from the substrate 1. A refractive index of the second optical film layer 5 ranges from 1.5 to 1.9. The refractive index of the first optical film layer 4 is less than the refractive index of the second optical film layer 5. In this embodiment, the refractive index of the second optical film layer 5 is 1.7. A material of the second optical film layer 5 may be an organic material doped with nanoparticles such as $ZrO_2$ or $TiO_2$, or may also be an organic and inorganic hybrid material such as metal alkoxide.

Figure 2:
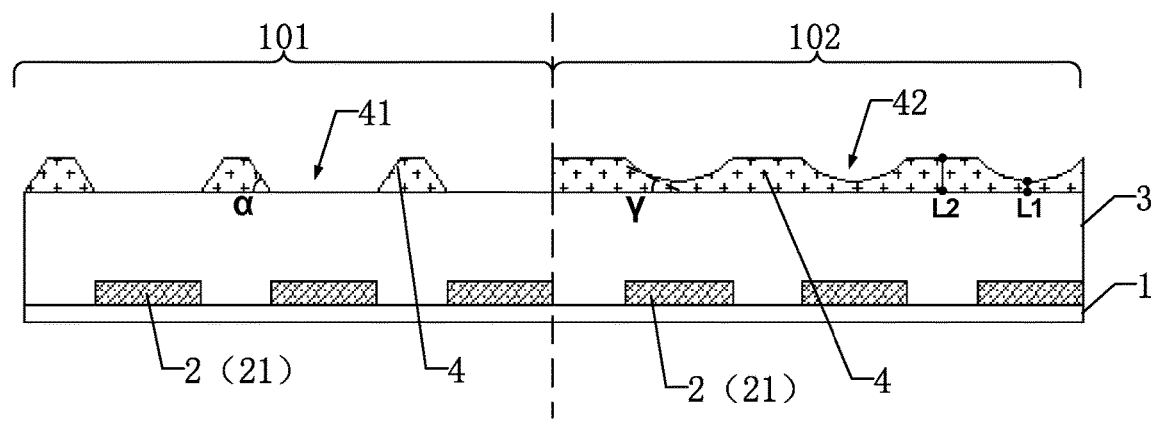
FIG. 2 is a schematic diagram of a first opening and a second opening according to embodiment 1 of the present disclosure.

As shown in FIGS. 1 and 2, the first optical film layer 4 is provided with at least one first opening 41 corresponding to a position of the sub-pixels 21 in the planar display area 101. Wherein, the second optical film layer 5 is filled in the first opening 41. In this embodiment, the first optical film layer 4 is provided with first openings 41 corresponding to the sub-pixels 21 by one-to-one in the planar display area 101.

In this embodiment, the first openings 41 are through-holes penetrating through the first optical film layer 4, and a cross-sectional shape of the first openings 41 is inverted trapezoidal. One side surface of the first optical film layer 4 adjacent to the substrate 1 is parallel to one side surface of the substrate 1 adjacent to the first optical film layer 4. Therefore, an included angle between a tangent line of a side wall of the first openings 41 and the substrate 1 is equal to an included angle α between the side wall of the first openings 41 and the side surface of the first optical film layer 4 adjacent to the substrate 1. Wherein, the included angle α ranges from 65° to 75°. In this embodiment, the included angle α is 70°.

As shown in FIGS. 1 and 2, the first optical film layer 4 is provided with at least one second opening 42 corresponding to a position of the sub-pixels 21 in the non-planar display area 102. Wherein, the second optical film layer 5 is filled in the second opening 42.

Wherein, in per unit area, a light-concentrating intensity of light emitted from the sub-pixels 21 in the non-planar display area 102 and passing through the first optical film layer 4 and the second optical film layer 5 at a front viewing angle is less than a light-concentrating intensity of light emitted from the sub-pixels 21 in the planar display area 101 and passing through the first optical film layer 4 and the second optical film layer 5 at the front viewing angle. Therefore, poor user experiences at a certain viewing angle in the non-planar display area in current technology can be improved, thereby improving user experiences. In practical applications, the light-concentrating intensities at the front viewing angle after the light passing through the first optical film layer and the second optical film layer may be detected under a same condition (for example, selecting light-emitting areas having a same unit area in the non-planar display area and the planar display area, emitting light under control of a same driving current, detecting at a position having a same distance to the non-planar display area and the planar display area, detecting at a same viewing angle, etc.). Based on this, a differentiated optical improvement effect of the first optical film layer and the second optical film layer between the non-planar display area and the planar display area can be judged.

In this embodiment, the first optical film layer 4 is provided with second openings 42 corresponding to the sub-pixels 21 by one-to-one in the non-planar display area 102. That is, in this embodiment, a density of the second openings 42 corresponding to the sub-pixels 21 in the non-planar display area 102 is equal to a density of the first openings 41 corresponding to the sub-pixels 21 in the planar display area 101.

In this embodiment, the second openings 42 are grooves which do not penetrate through the first optical film layer 4, and a cross-sectional shape of the second openings 42 is arc. In this embodiment, in the non-planar display area 102, a minimum thickness L1 of the first optical film layer 4 corresponding to the second openings 42 ranges from 10% to 30% of a maximum thickness L2 of the first optical film layer 4 which does not correspond to the second openings 42. Specifically, in the non-planar display area 102, the minimum thickness L1 of the first optical film layer 4 corresponding to the second openings 42 ranges from 0.3 μm to 0.7 μm. The maximum thickness L2 of the first optical film layer 4 which does not correspond to the second openings 42 ranges from 1.5 μm to 2.5 μm. Therefore, stresses in the non-planar display area 102 can be reduced, thereby reducing the stress concentration effect in the non-planar display area 102 and preventing the first optical film layer 4 and the second optical film layer 5 from falling off or cracking. Further, the light-concentrating effect in the non-planar display area 102 can also be reduced, so poor user experiences at a certain viewing angle in the non-planar display area 102 in current technology can be improved, thereby improving user experiences.

As shown in FIGS. 1 and 2, the side surface of the first optical film layer 4 adjacent to the substrate 1 is parallel to the side surface of the substrate 1 adjacent to the first optical film layer 4. Therefore, an included angle between a tangent line of a side wall of the second openings 42 and the substrate 1 is equal to an included angle γ between the side wall of the second openings 42 and the side surface of the first optical film layer 4 adjacent to the substrate 1. Wherein, the included angle γ ranges from 20° to 50°. In this embodiment, the included angle γ is 35°.

As shown in FIG. 2, the included angle γ is smaller than the included angle α, that is, the included angle γ is slightly gentler than the included angle α, and a light-concentrating effect of the second openings 42 and the second optical film layer 5 in the non-planar display area 102 is slightly lower than that of the first openings 41 and the second optical film layer 5 in the planar display area 101. Therefore, poor user experiences at the certain viewing angle in the non-planar display area 102 in current technology can be improved, thereby improving user experiences.

As shown in FIG. 2, the included angle γ is smaller than the included angle α, that is, the included angle γ is slightly gentler than the included angle α, that is, a sudden change in a shape of the second openings 42 in the non-planar display area 102 can be reduced. Therefore, stresses in the non-planar display area 102 can be reduced, thereby reducing the stress concentration effect in the non-planar display area 102 and preventing the first optical film layer 4 and the second optical film layer 5 from falling off or cracking.

Embodiment 2

Figure 3:
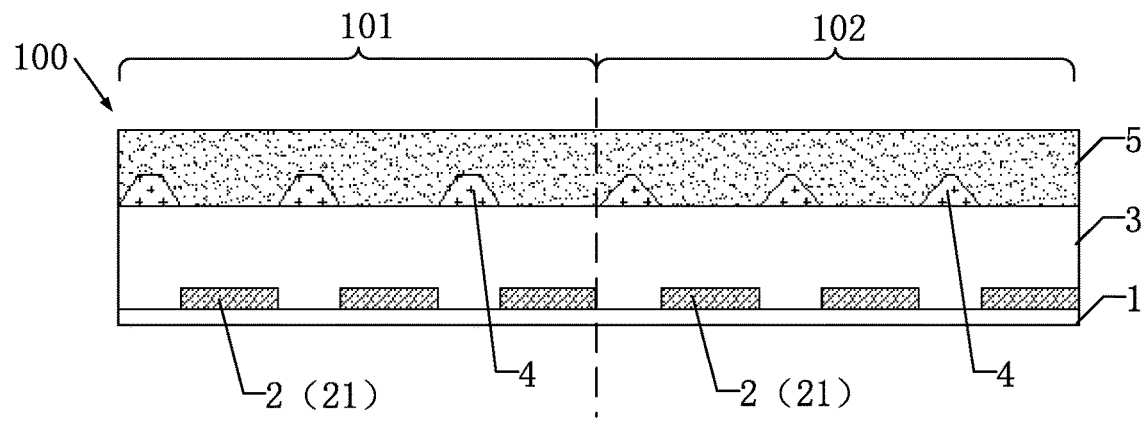
FIG. 3 is a schematic structural diagram of the display device before bending according to embodiment 2 of the present disclosure.

As shown in FIG. 3, this embodiment provides a display device 100. The display device 100 includes a planar display area 101 and a non-planar display area 102.

In this embodiment, the display device 100 is a curved display device, and the non-planar display area 102 is a curved display area. In other embodiments, the display device 100 may also be a foldable display device, and the non-planar display area 102 is a bending display area.

As shown in FIG. 3, the display device 100 includes a substrate 1, a light-emitting layer 2, an encapsulation layer 3, a first optical film layer 4, and a second optical film layer 5.

Wherein, the substrate 1 is located in the planar display area 101 and the non-planar display area 102. A material of the substrate 1 may be one or more of glass, polyimide, polycarbonate, polyethylene terephthalate, or polyethylene naphthalate. Therefore, the substrate 1 can have a better impact resistance, thereby effectively protecting the display device 100.

The light-emitting layer 2 is disposed on the substrate 1. The light-emitting layer 2 includes a plurality of sub-pixels 21 arranged spaced apart from each other on the substrate 1.

The encapsulation layer 3 is disposed on one side of the light-emitting layer 2 away from the substrate 1. The encapsulation layer 3 is mainly used to prevent water and oxygen from intruding the light-emitting layer 2, thereby improving a service life of the display device 100. Specifically, the encapsulation layer 3 may include a first inorganic layer, an organic layer, and a second inorganic layer.

As shown in FIG. 1, the first optical film layer 4 is disposed on one side of the encapsulation layer 3 away from the substrate 1. A refractive index of the first optical film layer 4 ranges from 1.3 to 1.6. In this embodiment, the refractive index of the first optical film layer 4 is 1.4. A material of the first optical film layer 4 may be an organic material such as acrylic or an epoxy resin, or may also be an inorganic material such as $SiO_2$ or SiON.

As shown in FIG. 1, the second optical film layer 5 covers one side surface of the first optical film layer 4 away from the substrate 1. A refractive index of the second optical film layer 5 ranges from 1.5 to 1.9. The refractive index of the first optical film layer 4 is less than the refractive index of the second optical film layer 5. In this embodiment, the refractive index of the second optical film layer 5 is 1.7. A material of the second optical film layer 5 may be an organic material doped with nanoparticles such as $ZrO_2$ or $TiO_2$, or may also be an organic and inorganic hybrid material such as metal alkoxide.

Figure 4:
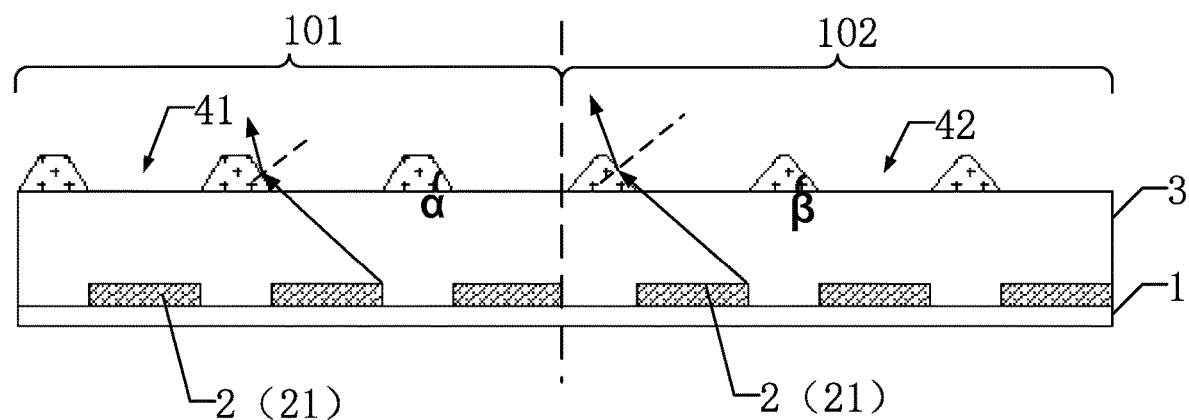
FIG. 4 is a schematic diagram of the first opening and the second opening according to embodiment 2 of the present disclosure.

As shown in FIGS. 3 and 4, the first optical film layer 4 is provided with at least one first opening 41 corresponding to a position of the sub-pixels 21 in the planar display area 101. Wherein, the second optical film layer 5 is filled in the first opening 41. In this embodiment, the first optical film layer 4 is provided with first openings 41 corresponding to the sub-pixels 21 by one-to-one in the planar display area 101.

In this embodiment, the first openings 41 are through-holes penetrating through the first optical film layer 4, and a cross-sectional shape of the first openings 41 is inverted trapezoidal. One side surface of the first optical film layer 4 adjacent to the substrate 1 is parallel to one side surface of the substrate 1 adjacent to the first optical film layer 4. Therefore, an included angle between a tangent line of a side wall of the first openings 41 and the substrate 1 is equal to an included angle α between the side wall of the first openings 41 and the side surface of the first optical film layer 4 adjacent to the substrate 1. Wherein, the included angle α ranges from 65° to 75°. In this embodiment, the included angle α is 70°.

As shown in FIGS. 3 and 4, the first optical film layer 4 is provided with at least one second opening 42 corresponding to a position of the sub-pixels 21 in the non-planar display area 102.

Wherein, in per unit area, a light-concentrating intensity of light emitted from the sub-pixels 21 in the non-planar display area 102 and passing through the first optical film layer 4 and the second optical film layer 5 at a front viewing angle is less than a light-concentrating intensity of light emitted from the sub-pixels 21 in the planar display area 101 and passing through the first optical film layer 4 and the second optical film layer 5 at the front viewing angle. Therefore, poor user experiences at a certain viewing angle in the non-planar display area in current technology can be improved, thereby improving user experiences.

In this embodiment, the first optical film layer 4 is provided with second openings 42 corresponding to the sub-pixels 21 by one-to-one in the non-planar display area 102. That is, in this embodiment, a density of the second openings 42 corresponding to the sub-pixels 21 in the non-planar display area 102 is equal to a density of the first openings 41 corresponding to the sub-pixels 21 in the planar display area 101.

In this embodiment, the second openings 42 are through-holes penetrating through the first optical film layer 4, and a cross-sectional shape of the second openings 42 is inverted trapezoidal. One side surface of the first optical film layer 4 adjacent to the substrate 1 is parallel to one side surface of the substrate 1 adjacent to the first optical film layer 4. Therefore, an included angle between a tangent line of a side wall of the second openings 42 and the substrate 1 is equal to an included angle β between the side wall of the second openings 42 and the side surface of the first optical film layer 4 adjacent to the substrate 1. Wherein, the included angle β ranges from 20° to 50°. In this embodiment, the included angle β is 35°.

As shown in FIG. 4, the included angle β is smaller than the included angle α, that is, the included angle β is slightly gentler than the included angle α, so when light with a same incident angle irradiates on the side walls of the first openings 41 and the second openings 42 and is reflected, a light-concentrating effect of the second openings 42 and the second optical film layer 5 in the non-planar display area 102 is slightly lower than that of the first openings 41 and the second optical film layer 5 in the planar display area 101. Therefore, poor user experiences at the certain viewing angle in the non-planar display area 102 in current technology can be improved, thereby improving user experiences.

As shown in FIG. 4, the included angle β is smaller than the included angle α, that is, the included angle β is slightly gentler than the included angle α, that is, a sudden change in a shape of the second openings 42 in the non-planar display area 102 can be reduced. Therefore, stresses in the non-planar display area 102 can be reduced, thereby reducing the stress concentration effect in the non-planar display area 102 and preventing the first optical film layer 4 and the second optical film layer 5 from falling off or cracking.

Embodiment 3

Figure 5:
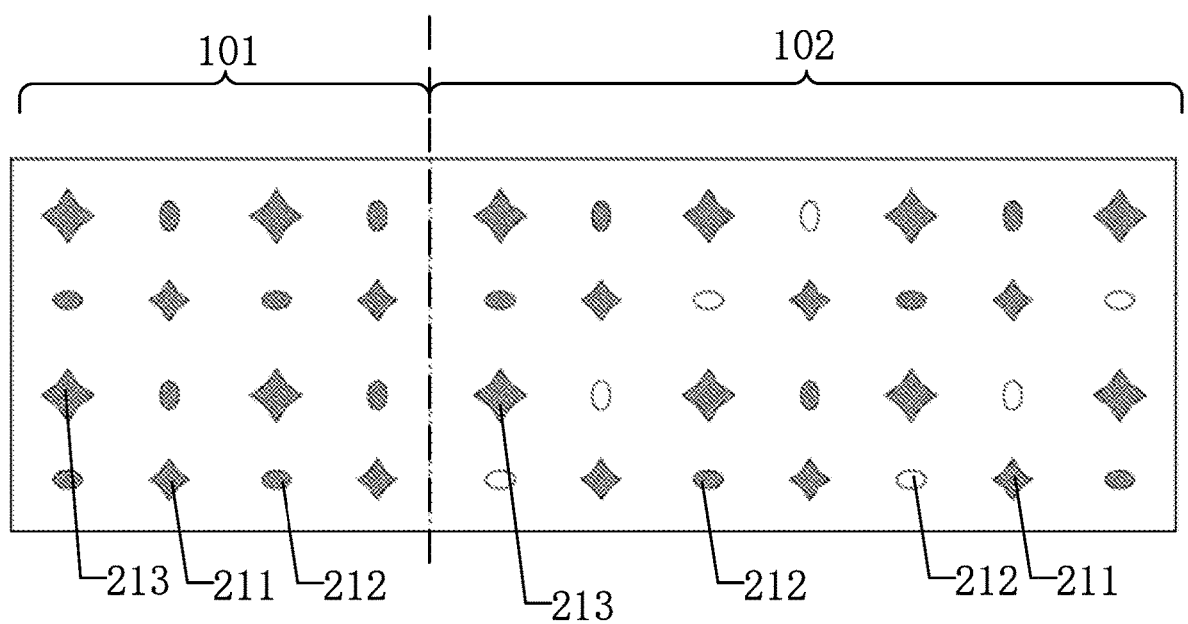
FIG. 5 is a schematic planar diagram of the display device according to embodiment 3 of the present disclosure.

As shown in FIG. 5, this embodiment includes most technical features of embodiments 1 and 2, and a difference between this embodiment and embodiments 1 and 2 is that: in this embodiment, the density of the second openings 42 corresponding to the sub-pixels 21 in the non-planar display area 102 is less than the density of the first openings 41 corresponding to the sub-pixels 21 in the planar display area 101.

As shown in FIG. 5, the sub-pixels 21 include red sub-pixels 211, green sub-pixels 212, and blue sub-pixels 213. Wherein, the sub-pixels 21 filled with shadows in the planar display area 101 mean that the first optical film layer 4 corresponding to the sub-pixels 21 is provided with the first openings 41. The sub-pixels 21 filled with shadows in the non-planar display area 102 mean that the first optical film layer 4 corresponding to the sub-pixels 21 is provided with the second openings 42, and the sub-pixels 21 that are not filled with shadows in the non-planar display area 102 mean that the first optical film layer 4 corresponding to the sub-pixels 21 is not provided with the second openings 42.

A luminous efficiency of the green sub-pixels 212 is higher than luminous efficiencies of the red sub-pixels 211 and the blue sub-pixels 213, so in this embodiment, the density of the second openings 42 corresponding to the green sub-pixels 212 in the non-planar display area 102 is reduced. Specifically, the density of the second openings 42 corresponding to the green sub-pixels 212 in the non-planar display area 102 ranges from 0% to 75% of the density of the first openings 41 corresponding to the green sub-pixels 212 in the planar display area 101.

Therefore, stresses in the non-planar display area 102 can be reduced by reducing the density of the second openings 42 corresponding to the sub-pixels 21 in the non-planar display area 102, thereby reducing the stress concentration effect in the non-planar display area 102 and preventing the first optical film layer 4 and the second optical film layer 5 from falling off or cracking.

The display device provided in the embodiments of the present disclosure is described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display device, having a planar display area and a non-planar display area and comprising:
    a substrate;
    a light-emitting layer disposed on one side of the substrate and comprising a plurality of sub-pixels arranged spaced apart from each other;
    a first optical film layer disposed on one side of the light-emitting layer away from the substrate, wherein the first optical film layer is provided with at least one first opening corresponding to a position of the sub-pixels in the planar display area, and the first optical film layer is provided with at least one second opening corresponding to a position of the sub-pixels in the non-planar display area; and
    a second optical film layer covering one side of the first optical film layer away from the substrate and filled in the first opening and the second opening, wherein a refractive index of the first optical film layer is less than a refractive index of the second optical film layer;
    wherein in per unit area, a light-concentrating intensity of light emitted from the sub-pixels in the non-planar display area and passing through the first optical film layer and the second optical film layer at a front viewing angle is less than a light-concentrating intensity of light emitted from the sub-pixels in the planar display area and passing through the first optical film layer and the second optical film layer at the front viewing angle;
    wherein in a cross-section perpendicular to the substrate, an included angle between all tangent lines of side walls of the second opening and the substrate are less than an included angle between a tangent line of a side wall of the first opening and the substrate.

2. A display device, having a planar display area and a non-planar display area and comprising:
    a substrate;
    a light-emitting layer disposed on one side of the substrate and comprising a plurality of sub-pixels arranged spaced apart from each other;
    a first optical film layer disposed on one side of the light-emitting layer away from the substrate, wherein the first optical film layer is provided with at least one first opening corresponding to a position of the sub-pixels in the planar display area, and the first optical film layer is provided with at least one second opening corresponding to a position of the sub-pixels in the non-planar display area; and
    a second optical film layer covering one side of the first optical film layer away from the substrate and filled in the first opening and the second opening, wherein a refractive index of the first optical film layer is less than a refractive index of the second optical film layer;
    wherein in per unit area, a light-concentrating intensity of light emitted from the sub-pixels in the non-planar display area and passing through the first optical film layer and the second optical film layer at a front viewing angle is less than a light-concentrating intensity of light emitted from the sub-pixels in the planar display area and passing through the first optical film layer and the second optical film layer at the front viewing angle;
    wherein in a cross-section perpendicular to the substrate, an included angle between a tangent line of a side wall of the second opening and the substrate is less than an included angle between a tangent line of a side wall of the first opening and the substrate;
    wherein in the non-planar display area, a minimum thickness of the first optical film layer corresponding to the second opening ranges from 10% to 30% of a maximum thickness of the first optical film layer not corresponding to the second opening.

3. The display device according to claim 2, wherein in the non-planar display area, the minimum thickness of the first optical film layer corresponding to the second opening ranges from 0.3 μm to 0.7 μm, and the maximum thickness of the first optical film layer not corresponding to the second opening ranges from 1.5 μm to 2.5 μm.

4. The display device according to claim 2, wherein the second opening is a groove which does not penetrate through the first optical film layer, and a cross-sectional shape of the second opening is arc; and
    the first opening penetrates through the first optical film layer.

5. The display device according to claim 1, wherein the included angle between the tangent line of the side wall of the second opening and the substrate ranges from 20° to 50°.

6. The display device according to claim 5, wherein the first opening and the second opening both penetrate through the first optical film layer; and
    cross-sectional shapes of the first opening and the second opening are inverted trapezoidal, and the included angle between the tangent line of the side wall of the first opening and the substrate ranges from 65° to 75°.

7. The display device according to claim 1, wherein a density of the second opening in the non-planar display area is less than or equal to a density of the first opening in the planar display area.

8. The display device according to claim 7, wherein the sub-pixels comprise red sub-pixels, green sub-pixels, and blue sub-pixels; and
    the density of the second opening corresponding to the green sub-pixels in the non-planar display area ranges from 0% to 75% of the density of the first opening corresponding to the green sub-pixels in the planar display area.

9. The display device according to claim 1, wherein the refractive index of the first optical film layer ranges from 1.3 to 1.6, and the refractive index of the second optical film layer ranges from 1.5 to 1.9.

* * * * *